(12) United States Patent
Defensor et al.

(10) Patent No.: US 9,912,290 B2
(45) Date of Patent: Mar. 6, 2018

(54) HIGH CURRENT BURN-IN OF SOLAR CELLS

(71) Applicant: SUNPOWER CORPORATION, San Jose, CA (US)

(72) Inventors: Michael J Defensor, Santa Rosa (PH); Xiuwen Tu, San Jose, CA (US); Junbo Wu, San Jose, CA (US); David Smith, Campbell, CA (US)

(73) Assignee: SunPower Corporation, San Jose, CA (US)

( * ) Notice: Subject to any disclaimer, the term of this patent is extended or adjusted under 35 U.S.C. 154(b) by 363 days.

(21) Appl. No.: 13/627,772

(22) Filed: Sep. 26, 2012

(65) Prior Publication Data

US 2013/0333747 A1 Dec. 19, 2013

Related U.S. Application Data

(60) Provisional application No. 61/661,285, filed on Jun. 18, 2012.

(51) Int. Cl.
*H01L 31/18* (2006.01)
*H02S 50/10* (2014.01)

(52) U.S. Cl.
CPC ............ *H02S 50/10* (2014.12); *H01L 31/186* (2013.01); *Y02E 10/50* (2013.01); *Y02P 70/521* (2015.11)

(58) Field of Classification Search
CPC . H01L 31/186; H01L 31/208; H01L 27/1421; H01L 31/0443; H01L 31/1421; H02S 50/10; H02S 50/15
USPC ............... 136/243–265, 290; 438/4, 12, 88; 324/761.01, 718
See application file for complete search history.

(56) References Cited

U.S. PATENT DOCUMENTS

| | | | | |
|---|---|---|---|---|
| 4,292,092 A | * | 9/1981 | Hanak | 438/74 |
| 4,806,496 A | * | 2/1989 | Suzuki et al. | 438/12 |
| 4,812,415 A | * | 3/1989 | Yamazaki et al. | 438/80 |
| 2002/0007846 A1 | | 1/2002 | Kawano | |
| 2010/0089432 A1 | * | 4/2010 | Dubbeldam | H01L 31/1872 136/244 |
| 2010/0132776 A1 | | 6/2010 | Nakata | |

FOREIGN PATENT DOCUMENTS

| JP | 2004327859 | 11/2004 |
|---|---|---|
| JP | 2004327859 A | 11/2004 |
| JP | 2004363196 | 12/2004 |

(Continued)

OTHER PUBLICATIONS

JP 2004-363196 English machine translation.*

(Continued)

*Primary Examiner* — Jeffrey T Barton
*Assistant Examiner* — Andrew Golden
(74) *Attorney, Agent, or Firm* — Schwabe, Williamson & Wyatt, P.C.

(57) ABSTRACT

A method of high reverse current burn-in of solar cells and a solar cell with a burned-in bypass diode are described herein. In one embodiment, high reverse current burn-in of a solar cell with a tunnel oxide layer induces low breakdown voltage in the solar cell. Soaking a solar cell at high current can also reduce the difference in voltage of defective and non-defective areas of the cell.

12 Claims, 6 Drawing Sheets

(56) References Cited

FOREIGN PATENT DOCUMENTS

JP 2009141056 6/2009
KR 1020100024511 3/2010

OTHER PUBLICATIONS

Kaminiski, A., et al., "Application of Infrared Thermography to the Characterization of Multicristalline Silicon Solar Cells", *2004 J. Phys.: Condens. Matter* 16 S9. doi: 10.1088/0953-8984/16/2/002, Issue 2 (Jan. 21. 2004), 5 pages.
International Search Report and Written Opinion from PCT/US2012/070718 dated Apr. 22, 2013, 12 pgs.
International Preliminary Report on Patentability from PCT/US2012/070718 dated Dec. 31, 2014, 9 pgs.
Notification of Reasons for Refusal from Japanese Patent Application No. 2015-517231 dated Aug. 1, 2017, 6 pgs.

* cited by examiner

HIGH CURRENT BURN-IN OF SOLAR CELLS

PRIORITY

The present application is a Non-Provisional of, claims priority to, and incorporates by reference, the corresponding U.S. Provisional Patent Application No. 61/661,285 filed Jun. 18, 2012.

TECHNICAL FIELD

Embodiments of the present invention are in the field of renewable energy and, in particular, burn-in of solar cells.

BACKGROUND

Solar cells are devices for converting solar radiation into electrical energy. If a large reverse bias occurs in a solar cell, substantial power dissipation in the solar cell can result in heated areas known as hotspots. Hotspots can have a variety of causes. For example, when shaded or soiled, solar cells can be forced into reverse bias and experience local heating unless a bypass diode is turned on. Hotspots can also occur due to defects (e.g., PMOS defects) in a solar cell.

Hotspot testing is a method for testing solar cells. For example, hotspot testing can determine whether solar cells have a pre-determined voltage in reverse bias such that the cells remain at a sufficiently low temperature and do not become hotspots in the field.

DETAILED DESCRIPTION

A method of high reverse current burn-in of solar cells and a solar cell with a burned-in bypass diode are described herein. High reverse current burn-in can be performed prior to shipping a solar module, for example, during hotspot testing. Existing hotspot testing methods use a low current for reverse biasing solar cells. Hotspot testing with a low biasing current can exaggerate the difference in breakdown voltage of the defective and non-defective area of a device. A low biasing current can preferentially pass through the lowest breakdown voltage areas and further lower the breakdown voltage in those areas.

In one embodiment, a high reverse current burn-in of solar cells induces low breakdown voltage in the solar cells. Soaking solar cells at high current (e.g., applying a high reverse current to the solar cells) can also reduce the difference in voltage of defective and non-defective areas of the cell. In one embodiment, high reverse current burn-in of solar cells results in an improvement in yield due to, for example, reduction in the difference in breakdown voltages, which can lead to fewer hotspots.

In one embodiment, high reverse current burn-in of solar cells can be used in hotspot testing of solar cells with bypass diodes having a tunnel oxide layer. Solar cells with tunnel oxide layers can be prone to breakdowns in areas of the tunnel oxide layer having defects, which can result in a lack of uniformity of within-wafer breakdown voltages.

In the following description, numerous specific details are set forth, such as specific diode structures and process flow operations, in order to provide a thorough understanding of embodiments of the present invention. It will be apparent to one skilled in the art that embodiments of the present invention may be practiced without these specific details. Furthermore, it is to be understood that the various embodiments shown in the figures are illustrative representations and are not necessarily drawn to scale.

Figure 1:
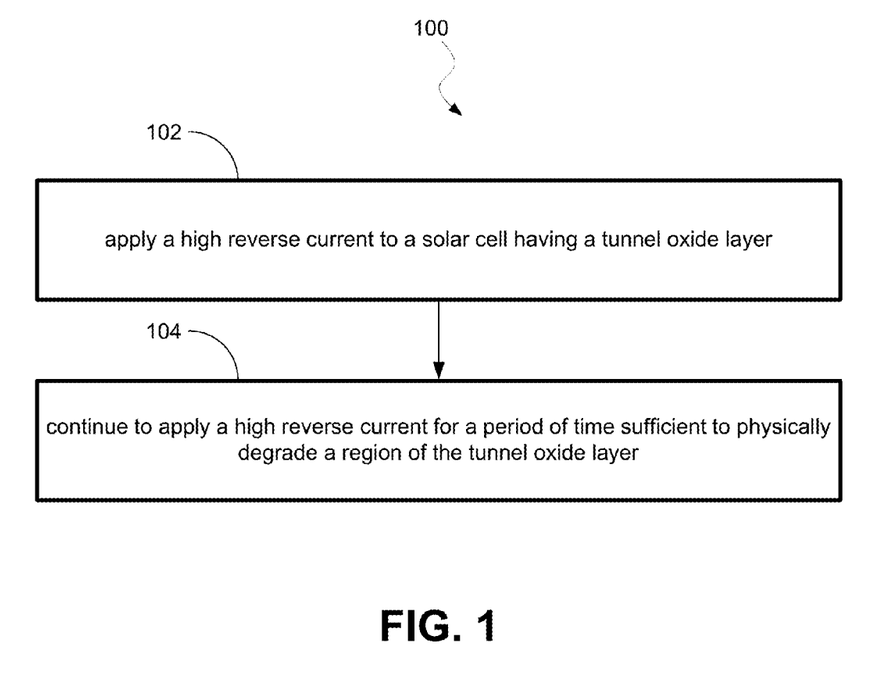
FIG. 1 illustrates a flow diagram of high reverse current burn-in, in accordance with an embodiment of the present invention.

FIG. 1 illustrates a flow diagram of high reverse current burn-in, in accordance with an embodiment of the present invention.

Flow diagrams as illustrated herein provide examples of sequences of various process actions. The illustrated implementations should be understood only as examples, and the illustrated processes can be performed in a different order, and some actions may be performed in parallel. Additionally, one or more actions can be omitted in various embodiments of the invention; thus, not all actions are required in every implementation. Other process flows are possible.

Method 100 is a method of high current burn-in. Method 100 can be performed prior to shipping a solar cell module (e.g., during hotspot testing), or during other times to improve the efficiency and/or performance of the solar module. Method 100 applies a high reverse current to a solar cell having a tunnel oxide layer, 102. A example of a solar cell having a tunnel oxide layer and a burned-in bypass diode to conduct current through the tunnel oxide layer is described below with reference to FIGS. 2a and 2b. In normal operation, a solar cell is forward biased and current is spread throughout the cell, resulting in the current density across the tunnel oxide layer to be relatively low. However, when a solar cell is reverse biased, current density can be high, resulting in the tunnel oxide layer acting as a barrier; although the tunnel oxide layer can act as a barrier when the solar cell is reverse-biased, reverse current can pass through the tunnel oxide layer. In one such embodiment, a portion of the reverse voltage is dropped across the tunnel oxide layer. For example, prior to burn-in of the solar cell, a voltage drop of up to 1.5V or more can occur across the tunnel oxide layer in reverse bias.

In one embodiment, the applied high reverse current flows through a thin region at the edge of a finger of the solar cell, and thus through a thin region of the tunnel oxide layer. For example, the region of the tunnel oxide through which the reverse current is to pass can have an area of 0.001% or less of the tunnel oxide layer of the solar cell. In another example, the reverse current passes through a region approximately 0.1 micron wide, 200 Angstroms wide, or any other sized sub-region of the solar cell.

In one embodiment, a high reverse current for burn-in of solar cells is higher than an operating current of the solar cell when the solar cell is reverse biased. An operating current when a solar cell is reverse biased is the current when the solar cell is operating (e.g., in the field) and becomes reverse biased. In one embodiment, a high reverse current for burn-in of solar cells is higher than an operating current of the solar cell when the solar cell is forward-biased (e.g., the current during normal operation of the solar cell).

The magnitude of the high reverse current for burn-in can depend on the size of the solar cell and/or the size of the region through which reverse current passes. In one embodiment, a high reverse current can have a magnitude that is 75%, 150%, or greater than the operating current of the solar cell in forward bias. For example, if the operating current of the solar cell in forward bias is 6 A, a high reverse current can be 5 A, 10 A, 15 A or other magnitudes of high reverse current.

The high reverse current for burn-in can be described in terms of current density. For example, a high reverse current can result in a current density that is higher than an operating current density of the solar cell when the solar cell is reverse biased. In one embodiment, the high reverse current results in a current density that is higher than an operating current density when the solar cell is forward biased. In one such example, the high current density resulting from the applied reverse current can be at least 30-40 mA/cm$^2$. In another example, the higher current density resulting from the applied reverse current can be at least 65 mA/cm$^2$. In yet another example, the higher current density resulting from the applied reverse current has a magnitude that is 75% or greater than the operating current density of the solar cell when in forward bias.

Method 100 continues to apply the high reverse current for a period of time sufficient to degrade (physically and/or electrically) the region of the tunnel oxide layer, 104. According to one embodiment, the period of time sufficient to physically degrade the region of the tunnel oxide layer depends on the high reverse current applied. For example, one magnitude of high reverse current can degrade a region of the tunnel oxide layer in hours or minutes, and a higher magnitude of reverse current can degrade the region in seconds or less than a second. In one embodiment, after burn-in of the solar cell, the voltage drop across the tunnel oxide layer in reverse bias is reduced or substantially eliminated.

Performing burn-in of solar cells with a high reverse current can allow current to flow through a small region across the cell, rather than preferentially passing through the lowest breakdown voltage areas. Causing current to flow through a larger area of the cell instead of primarily through the weakest points of the cell can reduce the difference in breakdown voltage over the cell uniformly. Reducing the difference in breakdown voltage lowers the risk of solar cells developing hotspots in the field. Thus, according to one embodiment, the breakdown lowering effect can be exploited to stabilize the breakdown voltage of such solar cells at a low value (e.g., the lowest possible value) before the solar cells are built into a module.

Figure 2A:
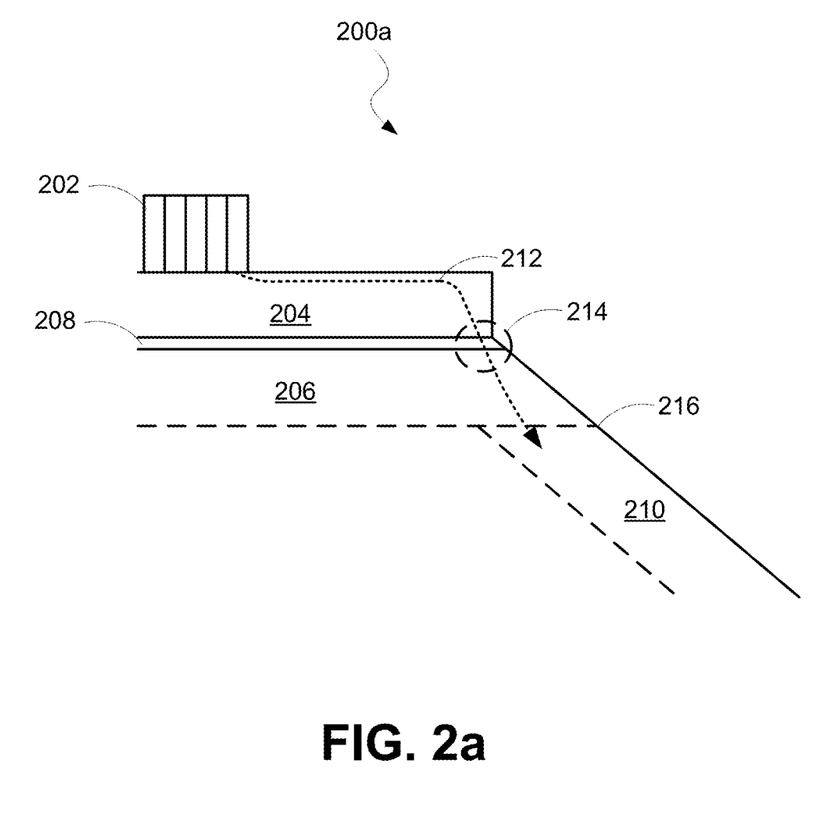
FIGS. 2a and 2b illustrate cross sections of solar cells with burned-in bypass diodes, in accordance with embodiments of the present invention.
Figure 2B:
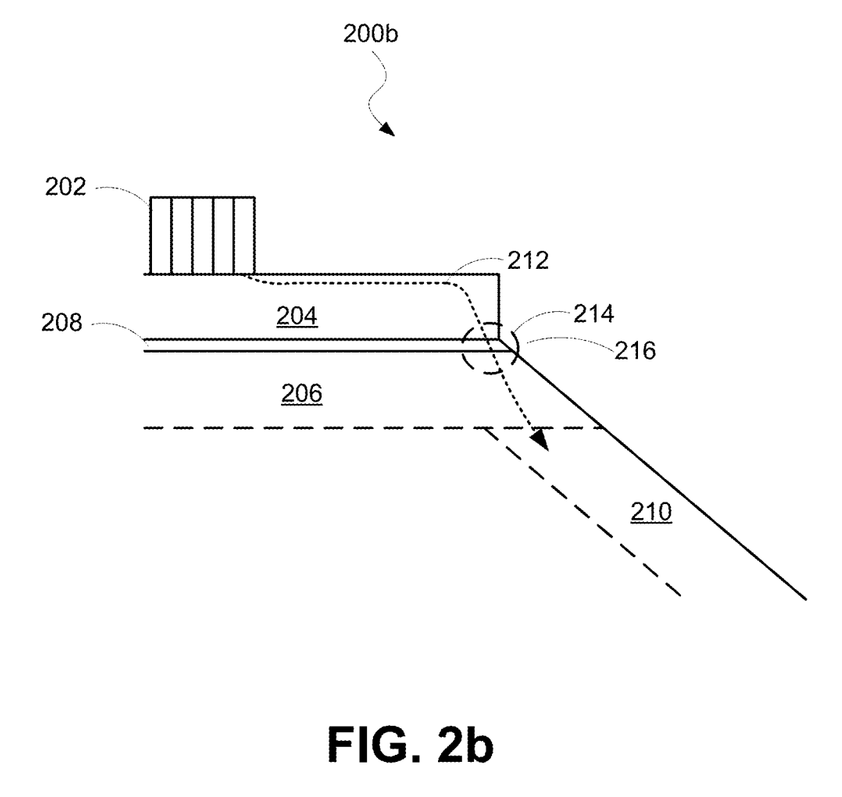

FIGS. 2a and 2b illustrate cross sections of solar cells with burned-in bypass diodes, in accordance with embodiments of the present invention.

According to one embodiment, solar cells can include a conductive substrate layer and a tunnel oxide layer disposed over the conductive substrate layer. For example, as illustrated, solar cells 200a and 200b include tunnel oxide layer 208 disposed over conductive substrate layer 206. Solar cells 200a and 200b also include conductive layer 204 disposed over tunnel oxide layer 208, and a contact 202 disposed over conductive layer 204. In one such embodiment, tunnel oxide layer 208 improves solar cell efficiency due to, for example, blockage of minority carriers. One or more of the layers can be disposed on a substrate as a finger that extends across the cell.

In one embodiment, tunnel oxide layer 208 is a silicon oxide layer having a thickness approximately in the range of 5-50 Angstroms. Tunnel oxide layer 208 can exhibit a breakdown lowering effect when subject to high reverse current. For example, a high reverse current can be applied with a magnitude sufficient to degrade (physically and/or electrically) both defective and non-defective portions of a region of the tunnel oxide layer 208 across the cell. A degraded region 214 of tunnel oxide layer 208 is indicated in FIGS. 2a and 2b with a dashed circle. Degraded region 214 can be formed by method 100 of FIG. 1, or other methods for degrading a region of the tunnel oxide layer. Degraded region 214 can be a relatively thin portion of the solar cell. For example, for a 200 micron wide finger, a 0.02-0.1 micron wide portion of tunnel oxide layer 208 across the cell can be degraded via high reverse current burn-in. After high current burn-in, current can still flow through tunnel oxide layer 208 in forward and reverse bias.

In one embodiment, solar cells 200a and 200b include a leakage pathway through the conductive substrate layer 206 and the degraded region 214 of the tunnel oxide layer 208 to conduct current when solar cells 200a and 200b are reverse biased. For example, solar cells 200a and 200b include a burned-in bypass diode 216, which includes conductive substrate layer 206 of the solar cell. When solar cells 200a and 200b are reverse biased, the solar cells are to conduct current through degraded region 214 of tunnel oxide layer 208 and burned-in bypass diode 216. Dotted line 212 indicates the path of current in reverse bias, according to the illustrated embodiment.

The burned-in bypass diode can be formed in different regions of the solar cell. For example, in FIG. 2a, burned-in bypass diode 216 can be formed at the junction of conductive substrate layer 206 and a second conductive substrate layer 210. In one such embodiment, conductive substrate layer 206 and conductive substrate layer 210 have different conductivity types. For example, solar cell 200a can include P+ poly region 204, P+ diffusion region 206, and N+ silicon region 210. In another example, solar cell 200a can include N+ poly region 204, N+ diffusion region 206, and P+ silicon region 210.

In FIG. 2b, burned-in bypass diode 216 can be formed at the junction of conductive substrate layer 206 and conductive layer 204. In one such embodiment, conductive substrate layer 206 and conductive layer 204 have different conductivity types. For example, solar cell 200b can include P+ poly region 204, N+ diffusion region 206, and N+ silicon region 210. In another example, solar cell 200b can include N+ poly region 204, P+ diffusion region 206, and P+ silicon region 210.

Embodiments of the invention may be included in solar cells having tunnel oxide layers other than the solar cells depicted in FIGS. 2a and 2b. Such solar cells may include a variety of features, for example back contacts (e.g., such as solar cells 200a of FIGS. 2a and 200b of FIG. 2b) or front contacts (e.g., such as front contact solar cells with backside-P Poly emitters). Different solar cells may experience burn-in at different magnitudes of reverse current. If the size of the region that the reverse current passes through is smaller, a lower high reverse current can be used to burn-in the solar cell. One such example is a solar cell with a front contact, in which the size of the region that the reverse current passes though is small, resulting in a high current density.

Figure 3:
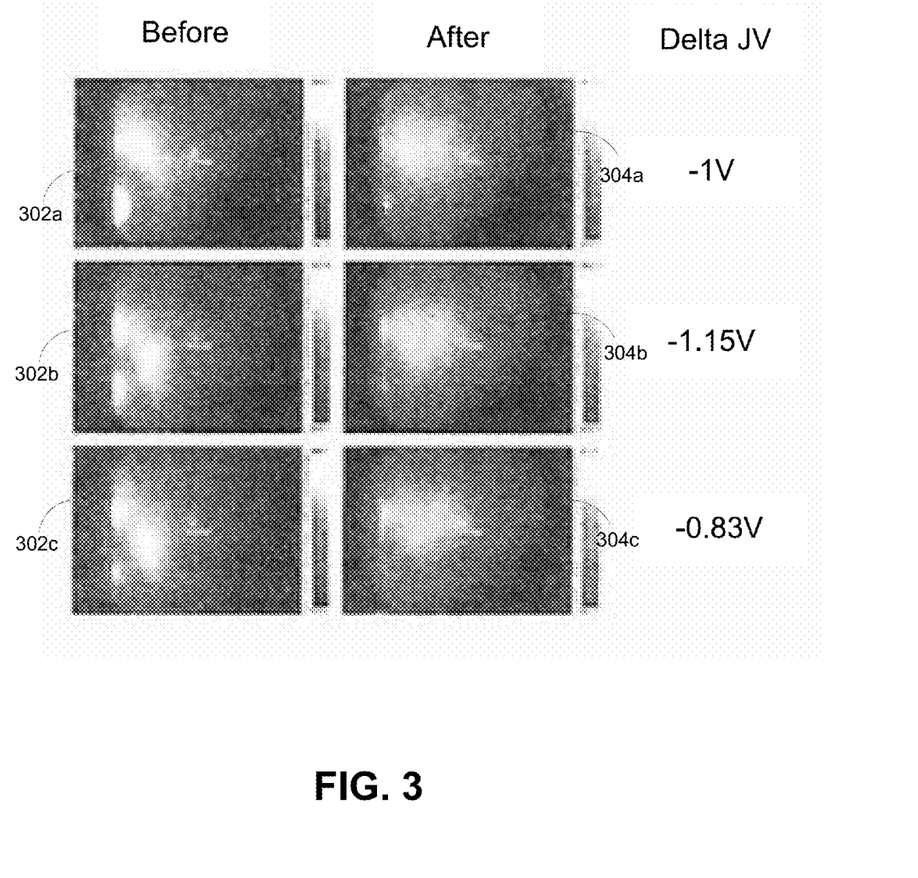
FIG. 3 illustrates infrared images of solar cells before and after high reverse current burn-in, in accordance with an embodiment of the present invention.

FIG. 3 illustrates infrared images of solar cells before and after high reverse current burn-in, in accordance with an embodiment of the present invention. The images in FIG. 3 are captured with an infrared camera and illustrate solar cells with low current density-voltage (JV), but high severity (e.g., >13). Images 302*a*-302*c* illustrate solar cells reverse biased at a lower current of 3 A. Images 302*a*-302*c* are "before" images prior to high current burn-in.

In this example, the solar cells are then soaked with a higher current for a period of time. For example, the solar cells are reverse biased with 10 A for 30 seconds, or other high reverse currents for a period of time. In one such embodiment, the high reverse current is applied to solar cells until breakdown of the desired regions of tunnel oxide occurs. Images 304*a*-304*c* are images captured with an infrared camera after current soaking with 10 A for 30 seconds. The delta JV is recorded for the solar cells. For example, the delta JV values recorded for a solar cell such as solar cell 200*a* or 200*b* are −1V, −1.15V, and −0.83V.

As illustrated, applying a high reverse current can allow the majority area of the solar cells to catch-up to the hotspots. Applying a high reverse current can recover solar cells with high severity due to local defects if the cells have a low initial JV. In one embodiment, marginal cells (e.g., solar cells with 9 to 13 severity) can also be recovered by high current soaking.

Figure 4:
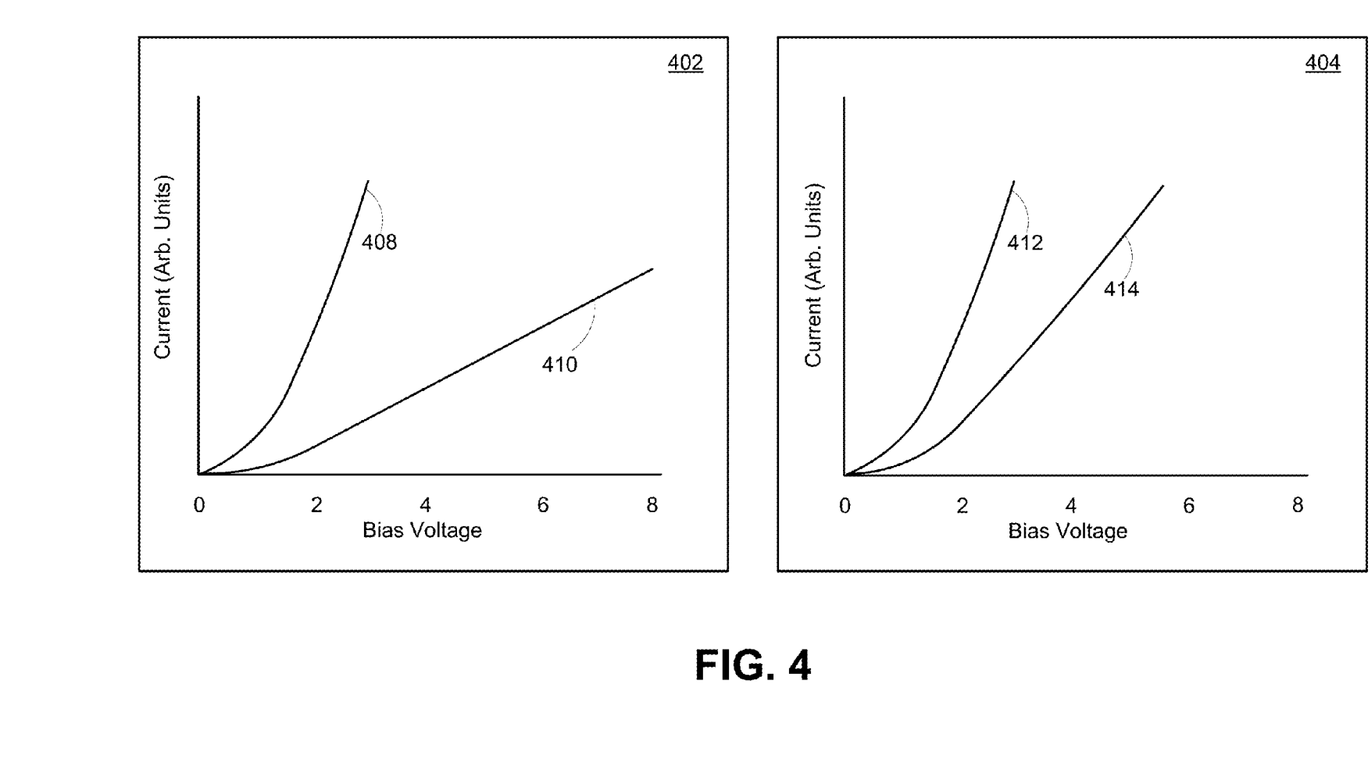
FIG. 4 illustrates IV curves of solar cells with different reverse currents applied, in accordance with an embodiment of the present invention.

FIG. 4 illustrates IV curves of solar cells with different reverse currents applied, in accordance with an embodiment of the present invention.

As described above, hotspot testing at low currents results in a substantial difference in breakdown voltage, as illustrated by the graph 402. A low testing current (e.g., 3 A or other low currents) passes primarily through areas of solar cells with defects, which further lowers the breakdown voltage in those areas. Therefore, as illustrated in graph 402, the IV curve 408 for defect areas is steeper than the IV curve 410 for the non-defect areas through which little test current passed.

In one embodiment, hotspot testing at high currents causes the current to pass through both defect and non-defect areas simultaneously. Passing current through both defect and non-defect areas of solar cells can minimize the IV difference after the test. For example, graph 404 shows an IV curve 412 for defect areas and IV curve 414 for non-defect areas after applying a high reverse current. As illustrated, the difference in IV curves for the defect and non-defect areas is substantially reduced.

In one embodiment, re-testing the solar cells using a smaller current after a high current test no longer results in significant changes to the breakdown voltage of the solar cells.

Figure 5:
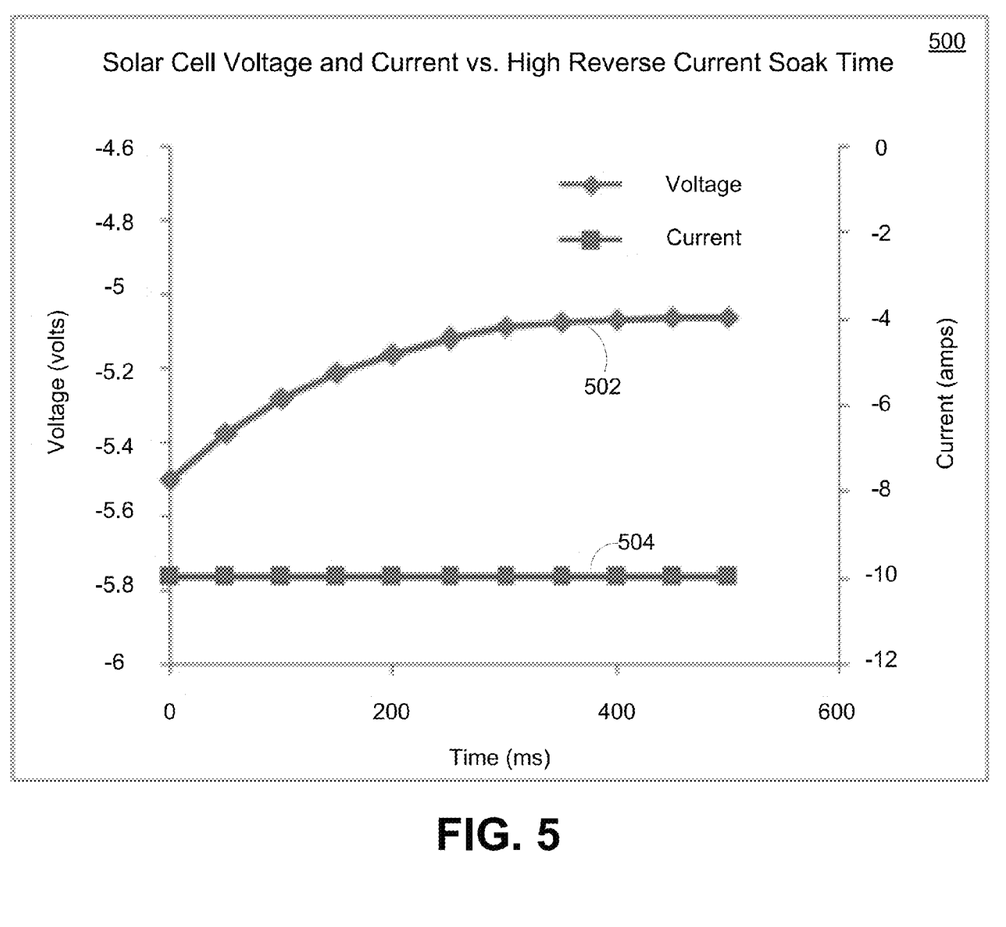
FIG. 5 illustrates solar cell reverse bias voltage and current after different high current soak times, in accordance with an embodiment of the present invention.

FIG. 5 illustrates solar cell reverse bias voltage and current after different high current soak times, in accordance with an embodiment of the present invention.

Graph 500 shows the voltage drop across a solar cell in reverse bias when a high reverse current is applied (e.g., when method 100 of FIG. 1 is applied). As illustrated by line 504, a high reverse current of 10 A was applied to a solar cell. The magnitude of full solar cell reverse voltage is −5.55V at time 0, and drops to −5.05V after application of the 10 A reverse current for 500 ms, as illustrated by line 502.

In some solar cells, the solar cell reverse bias voltage stabilizes after a high reverse current is applied for a short period of time. For example, as illustrated in graph 500, the solar cell reverse bias voltage begins to stabilize in less than 400 ms when a 10 A high reverse current is applied.

Thus, a method of high reverse current burn-in of solar cells is described. As described above, high reverse current burn-in of solar cells can induce low breakdown voltage in the solar cells and reduce the difference in voltage of defective and non-defective areas of the cell.

What is claimed is:

1. A method of improving efficiency of a solar cell, the method comprising:
    applying, to a tunnel oxide layer of the solar cell, a reverse current which is higher than an operating current of the solar cell when the solar cell is reverse biased, wherein the applied reverse current has a magnitude of 5 amps or greater, and wherein the tunnel oxide layer includes a defective portion having a first breakdown voltage and a non-defective portion having a second breakdown voltage;
    wherein the applied reverse current is to pass through the non-defective portion of the tunnel oxide layer of the solar cell;
    wherein the magnitude of the applied reverse current is sufficient to physically degrade the non-defective portion of the tunnel oxide layer to decrease the second breakdown voltage of the non-defective portion.

2. The method of claim 1, wherein the applied reverse current is higher than an operating current of the solar cell when the solar cell is forward biased.

3. The method of claim 1, wherein the applied reverse current results in a current density that is higher than an operating current density of the solar cell when the solar cell is forward biased.

4. The method of claim 1, wherein the applied reverse current results in a current density that is at least 30 mA/cm$^2$.

5. The method of claim 1, wherein the reverse current applied to the solar cell results in a current density that is 75% or greater than the operating current density of the solar cell when forward biased.

6. The method of claim 1, wherein the non-defective portion of the tunnel oxide layer through which the reverse current is to pass has an area of 0.001% or less of the tunnel oxide layer of the solar cell.

7. The method of claim 1, wherein applying the reverse current comprises applying the reverse current to the solar cell for a period of time sufficient to physically degrade the non-defective portion of the tunnel oxide layer, wherein the sufficient period of time is less than one minute.

8. A method of improving efficiency of a solar cell comprising:
    physically degrading a non-defective portion of a tunnel oxide layer in the solar cell via application of a reverse current having a magnitude of 5 amps or greater to form a physically degraded region of the non-defective portion of the tunnel oxide layer of the solar cell and to decrease a breakdown voltage of the solar cell;
    wherein current is to pass through the physically degraded region of the non-defective portion of the tunnel oxide layer of the solar cell when the solar cell is reverse biased.

9. The method of claim 8, wherein physically degrading the non-defective portion of the tunnel oxide layer in the solar cell comprises physically degrading both a defective portion and the non-defective portion across the solar cell.

10. The method of claim 8, wherein physically degrading the non-defective portion of the tunnel oxide layer in the solar cell comprises applying a reverse current to the solar cell, wherein the applied reverse current results in a current density that is 75% or greater than an operating current density of the solar cell when in forward bias.

11. The method of claim 8, wherein physically degrading the non-defective portion of the tunnel oxide layer in the solar cell comprises applying a reverse current to the solar cell, wherein the applied reverse current results in a current density of at least 30 mA/cm$^2$.

12. The method of claim 8, wherein physically degrading the non-defective portion of the tunnel oxide layer comprises reducing a voltage drop across the tunnel oxide layer when the solar cell is reverse biased.

* * * * *